(12) United States Patent
Nakamura

(10) Patent No.: US 9,490,171 B2
(45) Date of Patent: Nov. 8, 2016

(54) WAFER PROCESSING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/853,168

(22) Filed: Sep. 14, 2015

(65) Prior Publication Data

US 2016/0086853 A1    Mar. 24, 2016

(30) Foreign Application Priority Data

Sep. 18, 2014    (JP) .................................. 2014-189619

(51) Int. Cl.
  *H01L 21/78*    (2006.01)
(52) U.S. Cl.
  CPC ..................................... *H01L 21/78* (2013.01)
(58) Field of Classification Search
  CPC ..... H01L 21/78; H01L 21/82; H01L 21/782; H01L 21/6835; H01L 21/6836; H01L 21/68327; H01L 21/3043
  USPC .................................................. 438/460–465
  See application file for complete search history.

(56) References Cited

U.S. PATENT DOCUMENTS

2009/0186451 A1* 7/2009 Teshirogi .............. H01L 21/561
                                                      438/119
2011/0018127 A1* 1/2011 Lee ............................ C09J 7/00
                                                      257/729

FOREIGN PATENT DOCUMENTS

JP     2009-028810    2/2009

* cited by examiner

*Primary Examiner* — Karen Kusumakar
(74) *Attorney, Agent, or Firm* — Greer Burns & Crain Ltd.

(57) ABSTRACT

A wafer is divided along a plurality of crossing division lines to obtain a plurality of individual devices. The division lines are formed on the front side of the wafer to define a plurality of separate device regions. An adhesive film is applied to the back side of the wafer and the other side of the adhesive film is attached to a dicing tape composed of a base sheet and an ultraviolet curable adhesive layer formed on the base sheet. The adhesive film is attached to the ultraviolet curable adhesive layer of the dicing tape. Ultraviolet light is applied to the dicing tape to thereby cure the adhesive layer. A rotating cutting blade cuts the wafer together with the adhesive film along the division lines, dividing the wafer into the individual devices. The cutting blade is positioned so that its cutting edge cuts into the cured adhesive layer.

1 Claim, 7 Drawing Sheets

WAFER PROCESSING METHOD

BACKGROUND OF THE INVENTION

1. Field of the Invention

The present invention relates to a wafer processing method of dividing a wafer along a plurality of division lines to obtain a plurality of individual devices and mounting an adhesive film for die bonding on the back side of each device, the division lines being formed on the front side of the wafer to thereby define a plurality of separate regions where the respective devices are formed.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are formed. An adhesive film for die bonding called die attach film (DAF) is mounted on the back side of the semiconductor wafer having the devices on the front side. The adhesive film is formed of polyimide resin, epoxy resin, or acrylic resin, and has a thickness of 5 µm to 150 µm, for example. The semiconductor wafer is cut together with the adhesive film along the division lines to obtain the individual devices (see Japanese Patent Laid-Open No. 2009-28810, for example).

In general, a cutting apparatus is used to divide the semiconductor wafer. The cutting apparatus includes a cutting blade having a cutting edge for cutting the semiconductor wafer together with the adhesive film along the division lines. The cutting edge has a thickness of about 20 µm to 30 µm, for example. In cutting the semiconductor wafer together with the adhesive film along the division lines by using the cutting apparatus, the semiconductor wafer with the adhesive film is attached to a dicing tape supported to an annular frame in the condition where the adhesive film mounted on the back side of the semiconductor wafer is attached to the dicing tape. In such a condition that the semiconductor wafer with the adhesive film is supported through the dicing tape to the annular frame, the semiconductor wafer is held on a chuck table and the cutting blade is rotated to cut the semiconductor wafer together with the adhesive film along the division lines. However, there is a case that the cutting edge of the cutting blade may vibrate due to the elasticity of the adhesive film. The vibrations of the cutting edge of the cutting blade may cause chipping of the side surface of each device divided from the semiconductor wafer, so that each device may be degraded in die strength and quality.

To cope with this problem, the cutting blade is positioned so that the outer circumference of the cutting edge slightly cuts into a base sheet of the dicing tape. Accordingly, the cutting edge is supported by the base sheet of the dicing tape in cutting the semiconductor wafer with the adhesive film.

SUMMARY OF THE INVENTION

However, in the case that the outer circumference of the cutting edge of the cutting blade is positioned so as to slightly cut into the base sheet of the dicing tape, the base sheet of the dicing tape is cut by the cutting edge. Accordingly, burrs are generated from the base sheet and stick to the adhesive film, causing breaking of wire in bonding each device to a wiring board.

It is therefore an object of the present invention to provide a wafer processing method which can suppress vibrations of the cutting edge of the cutting blade and prevent the generation of burrs from the base sheet of the dicing tape in cutting the wafer together with the adhesive film along the division lines by using the cutting blade in the condition where the adhesive film for die bonding mounted on the back side of the wafer is attached to the dicing tape.

In accordance with an aspect of the present invention, there is provided a wafer processing method of dividing a wafer along a plurality of crossing division lines to obtain a plurality of individual devices and mounting an adhesive film for die bonding on a back side of each device, the division lines being formed on a front side of the wafer to thereby define a plurality of separate regions where the respective devices are formed, the wafer processing method including a wafer supporting step of mounting one side of the adhesive film on a back side of the wafer and attaching an other side of the adhesive film to a dicing tape composed of a base sheet and an ultraviolet curable adhesive layer formed on the base sheet, the adhesive film being attached to the ultraviolet curable adhesive layer of the dicing tape; an ultraviolet light applying step of applying ultraviolet light to the dicing tape to thereby cure the adhesive layer after performing the wafer supporting step; and a cutting step of rotating a cutting blade having a peripheral cutting edge to cut the wafer together with the adhesive film along the division lines after performing the ultraviolet light applying step, thereby dividing the wafer into the individual devices; the cutting edge of the cutting blade being positioned so that the cutting edge cuts into the cured adhesive layer in the cutting step.

According to the wafer processing method of the present invention, the cutting edge of the cutting blade is positioned so as to cut into the cured adhesive layer in the cutting step. Accordingly, the cutting edge of the cutting blade is supported by the cured adhesive layer, so that vibrations of the cutting edge can be suppressed to thereby prevent chipping of each device.

Further, in the cutting step, the annular cutting edge of the cutting blade is positioned so that the cutting edge cuts into the cured adhesive layer, but does not reach the base sheet of the dicing tape. That is, the base sheet is not cut by the cutting edge, so that no burrs are generated to thereby prevent possible breaking of wire.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
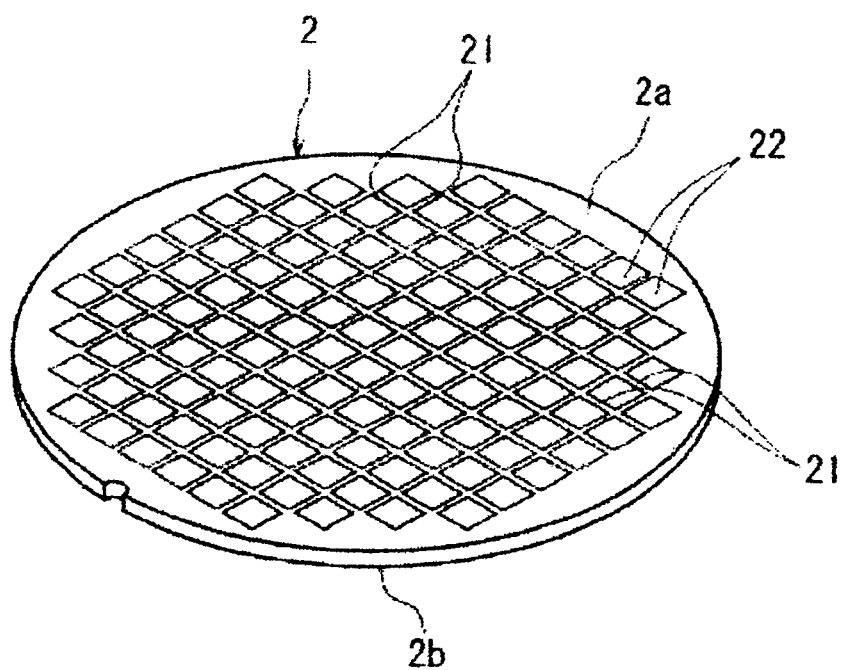
FIG. 1 is a perspective view of a semiconductor wafer.

A preferred embodiment of the wafer processing method according to the present invention will now be described in detail with reference to the attached drawings. FIG. 1 is a perspective view of a semiconductor wafer 2. The semiconductor wafer 2 shown in FIG. 1 is a silicon wafer having a thickness of 200 µm, for example. The semiconductor wafer 2 has a front side 2a and a back side 2b. A plurality of division lines 21 are formed on the front side 2a of the semiconductor wafer 2 to thereby define a plurality of separate regions where a plurality of devices 22 such as ICs and LSIs are formed. There will now be described a wafer processing method of dividing the semiconductor wafer 2 along the division lines 21 to obtain the individual devices 22 as chips and mounting an adhesive film for die bonding on the back side of each device 22.

Figure 2A:
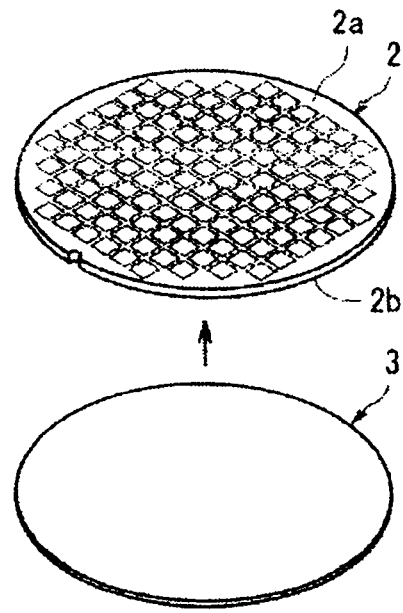
FIGS. 2A to 2D are views for illustrating a first preferred embodiment of a wafer supporting step in the present invention.
Figure 2B:
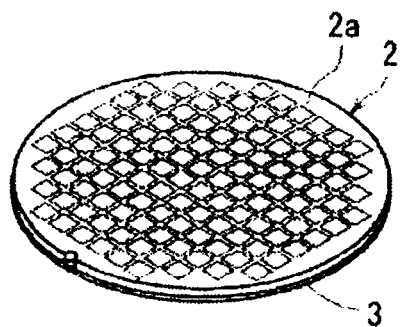
Figure 2C:
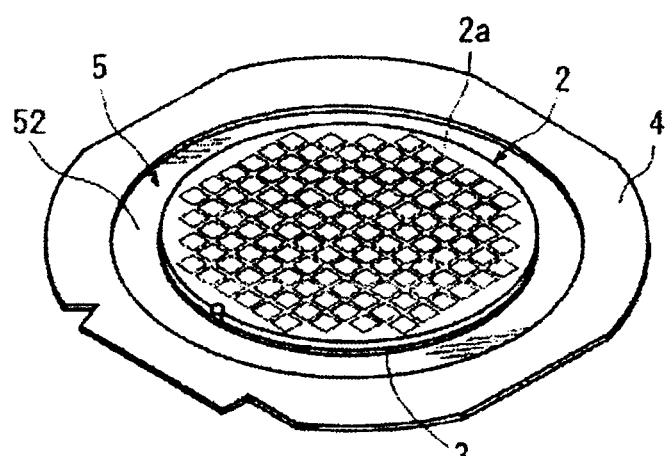
Figure 2D:
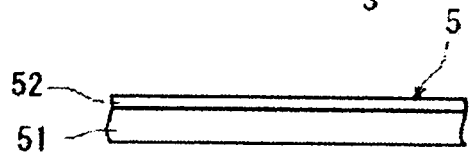

First, a wafer supporting step is performed in such a manner that one side of the adhesive film is mounted on the back side of the wafer and the other side of the adhesive film is attached to a dicing tape composed of a base sheet and an ultraviolet curable adhesive layer formed on the base sheet. A first preferred embodiment of the wafer supporting step will now be described with reference to FIGS. 2A to 2D. First, as shown in FIGS. 2A and 2B, an adhesive film 3 for die bonding is mounted on the back side 2b of the semiconductor wafer 2. The adhesive film 3 is an epoxy or acrylic resin film having a thickness of 100 µm, for example. After mounting the adhesive film 3 on the back side 2b of the semiconductor wafer 2, the adhesive film 3 is attached to a dicing tape 5 supported to an annular frame 4 as shown in FIG. 2C. As shown in FIG. 2D, the dicing tape 5 is composed of a base sheet 51 and an ultraviolet curable adhesive layer 52 formed on the front side of the base sheet 51. The base sheet 51 is formed of polyolefin and has a thickness of 70 µm, for example. The adhesive film 3 mounted on the back side 2b of the semiconductor wafer 2 is attached to the front side of the adhesive layer 52 of the dicing tape 5. The adhesive layer 52 is formed of acrylic resin and has a thickness of 30 µm, for example. In the preferred embodiment shown in FIGS. 2A to 2D, the adhesive film 3 mounted on the back side 2b of the semiconductor wafer 2 is attached to the dicing tape 5 preliminarily supported at its peripheral portion to the annular frame 4 as described above. As a modification, the central portion of the dicing tape 5 may be attached to the adhesive film 3 mounted on the back side 2b of the semiconductor wafer 2, and at the same time the peripheral portion of the dicing tape 5 may be mounted to the annular frame 4.

Figure 3A:
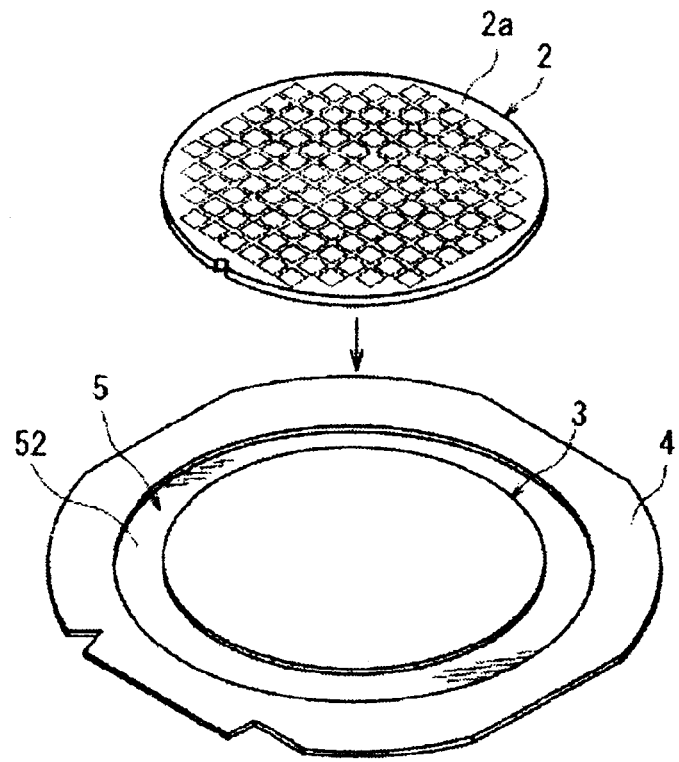
FIGS. 3A to 3C are views for illustrating a second preferred embodiment of the wafer supporting step.
Figure 3B:
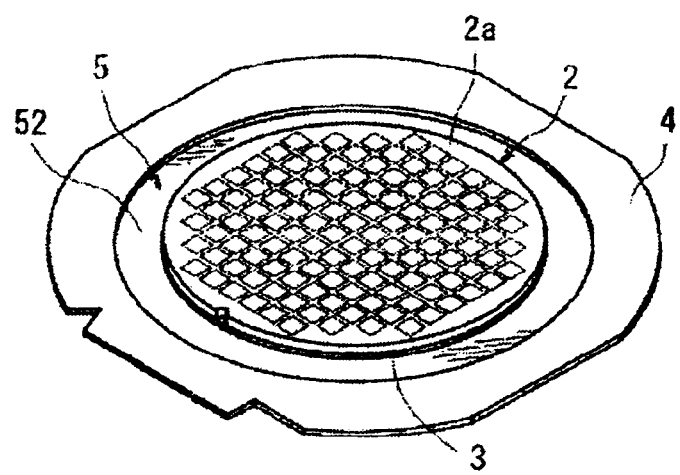
Figure 3C:
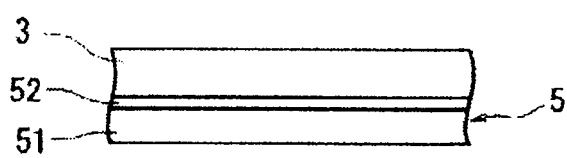

A second preferred embodiment of the wafer supporting step will now be described with reference to FIGS. 3A to 3C. The preferred embodiment shown in FIGS. 3A to 3C uses a dicing tape with an adhesive film such that an adhesive film 3 is preliminarily attached to the front side of a dicing tape 5. As shown in FIG. 3C, the dicing tape 5 is composed of a base sheet 51 and an ultraviolet curable adhesive layer 52 formed on the front side of the base sheet 51. The base sheet 51 is formed of polyolefin and has a thickness of 70 µm, for example. The adhesive layer 52 is formed of acrylic resin and has a thickness of 30 µm, for example. The adhesive film 3 is preliminarily attached to the front side of the adhesive layer 52 of the dicing tape 5. As shown in FIG. 3A, the peripheral portion of the dicing tape 5 is preliminarily supported to an annular frame 4 so as to close the inner opening of the annular frame 4, and the adhesive film 3 is preliminarily attached to the front side of the dicing tape 5 at its central portion exposed to the inner opening of the annular frame 4. First, as shown in FIGS. 3A and 3B, the back side 2b of the semiconductor wafer 2 is mounted on the adhesive film 3 attached to the dicing tape 5. In the case of using such a dicing tape with an adhesive film, the back side 2b of the semiconductor wafer 2 is mounted on the adhesive film 3 attached to the dicing tape 5 as described above, thereby supporting the semiconductor wafer 2 through the adhesive film 3 to the dicing tape 5 supported to the annular frame 4. In the preferred embodiment shown in FIGS. 3A and 3B, the back side 2b of the semiconductor wafer 2 is mounted on the adhesive film 3 attached to the dicing tape 5 preliminarily supported at its peripheral portion to the annular frame 4 as described above. As a modification, the adhesive film 3 attached to the central portion of the dicing tape 5 may be mounted on the back side 2b of the semiconductor wafer 2, and at the same time the peripheral portion of the dicing tape 5 may be mounted to the annular frame 4.

Figure 4:
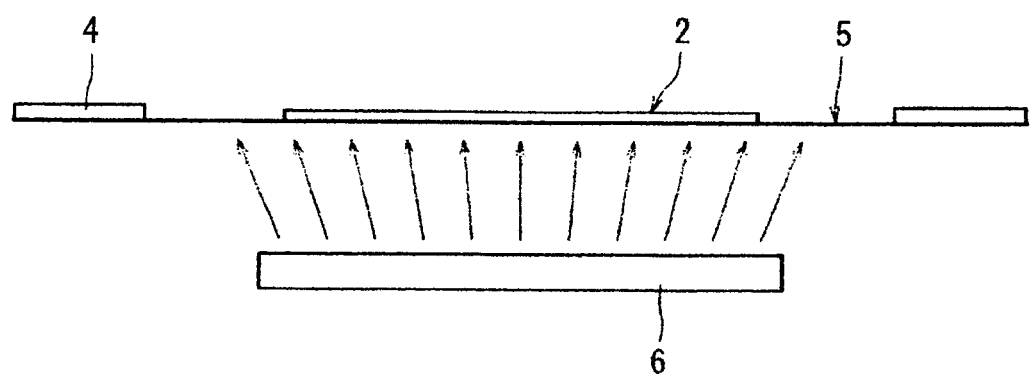
FIG. 4 is a view for illustrating an ultraviolet light applying step in the present invention.

After performing the wafer supporting step mentioned above, an ultraviolet light applying step is performed in such a manner that ultraviolet light is applied to the dicing tape 5 to thereby cure the adhesive layer 52. As shown in FIG. 4, ultraviolet light is applied from ultraviolet light applying means 6 to the back side of the dicing tape 5 supported at its peripheral portion to the annular frame 4. The power of the ultraviolet light to be applied may be set to 100 mW/cm$^2$ and the time of application of the ultraviolet light may be set to about two seconds. As a result, the ultraviolet curable adhesive layer 52 (see FIG. 2D or 3C) formed on the front side of the base sheet 51 of the dicing tape 5 is cured by the application of the ultraviolet light applied from the ultraviolet light applying means 6.

Figure 5:
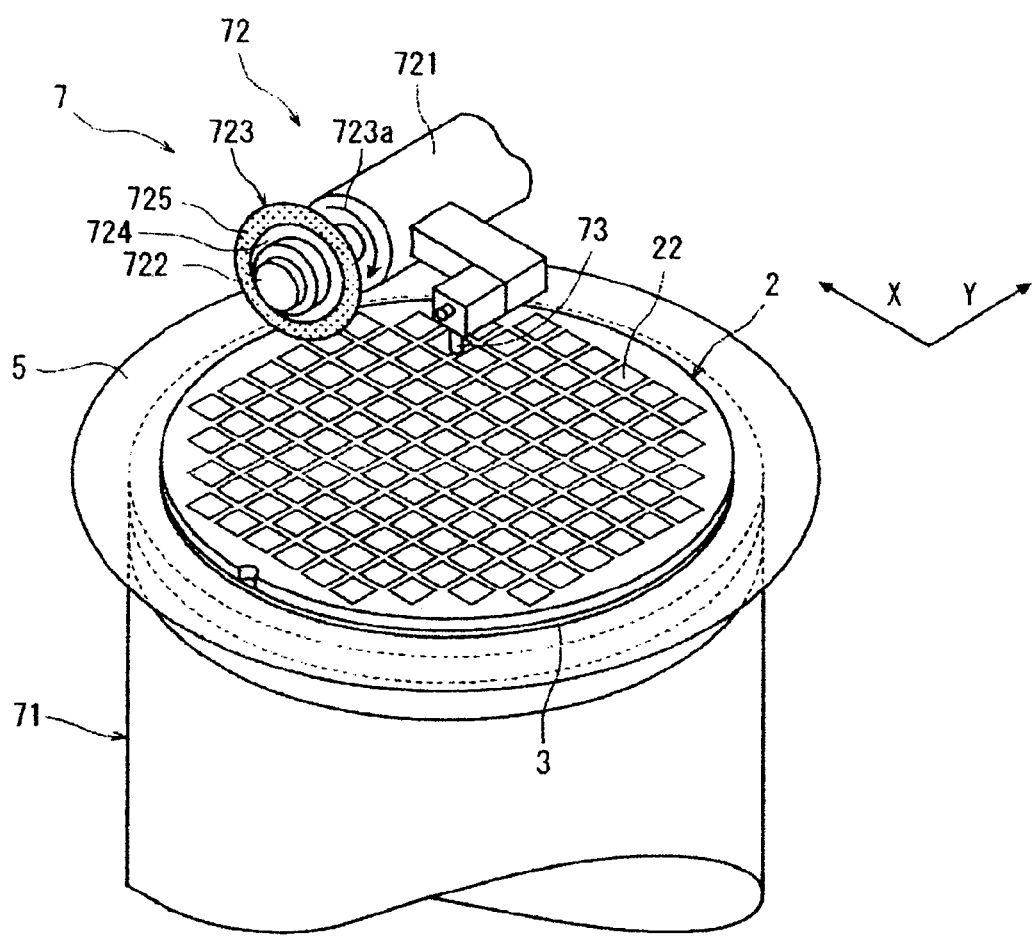
FIG. 5 is a perspective view of an essential part of a cutting apparatus for performing a cutting step in the present invention.

After performing the ultraviolet light applying step mentioned above, a cutting step is performed in such a manner that a cutting blade having a peripheral cutting edge is rotated to cut the semiconductor wafer 2 together with the adhesive film 3 along the division lines 21, thereby dividing the semiconductor wafer 2 into the individual devices. This cutting step is performed by using a cutting apparatus 7 shown in FIG. 5. The cutting apparatus 7 shown in FIG. 5 includes a chuck table 71 as workpiece holding means for holding a workpiece, cutting means 72 for cutting the workpiece held on the chuck table 71, and imaging means 73 for imaging the workpiece held on the chuck table 71. The chuck table 71 is adapted to hold the workpiece under suction. The chuck table 71 is movable in a feeding direction (X direction) shown by an arrow X in FIG. 5 by operating feeding means (not shown). The chuck table 71 is also movable in an indexing direction (Y direction) shown by an arrow Y in FIG. 5 by operating indexing means (not shown).

The cutting means 72 includes a spindle housing 721 extending in a substantially horizontal direction, a rotating spindle 722 rotatably supported to the spindle housing 721, and a cutting blade 723 mounted on a front end portion of the rotating spindle 722. The rotating spindle 722 is rotatable in the direction shown by an arrow 723a by operating a servo motor (not shown) provided in the spindle housing 721. The cutting blade 723 is composed of a disk-shaped base 724 formed of metal such as aluminum and an annular cutting edge 725 mounted on one side surface of the base 724 along the outer circumference thereof. The annular cutting edge 725 is an electroformed blade formed by bonding diamond abrasive grains through nickel plating to the outer circumferential portion of the base 724. The diamond abrasive grains have a grain size of 3 µm to 4 µm, for example. In this preferred embodiment, the cutting edge 725 has a thickness of 30 µm and an outer diameter of 50 mm.

The imaging means 73 is mounted on a front end portion of the spindle housing 721. The imaging means 73 includes illuminating means for illuminating the workpiece, an optical system for capturing an area illuminated by the illuminating means, and an imaging device (CCD) for imaging the area captured by the optical system. An image signal output from the imaging means 73 is transmitted to control means (not shown).

In performing the cutting step by using the cutting apparatus 7, the semiconductor wafer 2 processed by the ultraviolet light applying step is placed on the chuck table 71 in the condition where the dicing tape 5 attached through the adhesive film 3 to the semiconductor wafer 2 is in contact with the upper surface of the chuck table 71. Thereafter, suction means (not shown) is operated to hold the semiconductor wafer 2 with the adhesive film 3 through the dicing tape 5 on the chuck table 71 under suction (wafer holding step). Accordingly, the semiconductor wafer 2 is held on the chuck table 71 in the condition where the front side 2a of the wafer 2 is oriented upward. Although the annular frame 4 supporting the dicing tape 5 is not shown in FIG. 5, the annular frame 4 is actually held by suitable frame holding means (not shown) provided on the chuck table 71. After holding the semiconductor wafer 2 on the chuck table 71 under suction as described above, the chuck table 71 is moved to a position directly below the imaging means 73 by operating the feeding means (not shown) mentioned above.

In the condition where the chuck table 71 holding the semiconductor wafer 2 is positioned directly below the imaging means 73, an alignment step of detecting a subject area (cutting area) of the semiconductor wafer 2 to be cut is performed by the imaging means 73 and the control means (not shown). More specifically, the imaging means 73 and the control means (not shown) perform image processing such as pattern matching for making the alignment between the division lines 21 extending in a first direction on the semiconductor wafer 2 and the cutting blade 723 for cutting the semiconductor wafer 2 along the division lines 21, thereby performing the alignment for a cutting position. Similarly, the alignment step is performed for the other division lines 21 extending in a second direction perpendicular to the first direction on the semiconductor wafer 2.

After performing the alignment step to detect all of the division lines 21 of the semiconductor wafer 2 held on the chuck table 71, the chuck table 71 holding the semiconductor wafer 2 is moved to a cutting start position in the cutting area. At the cutting start position, one end (left end as viewed in FIG. 6A) of a predetermined one of the division lines 21 extending in the first direction is set on the right side of a position directly below the cutting blade 723 by a predetermined amount as shown in FIG. 6A.

Figure 6A:
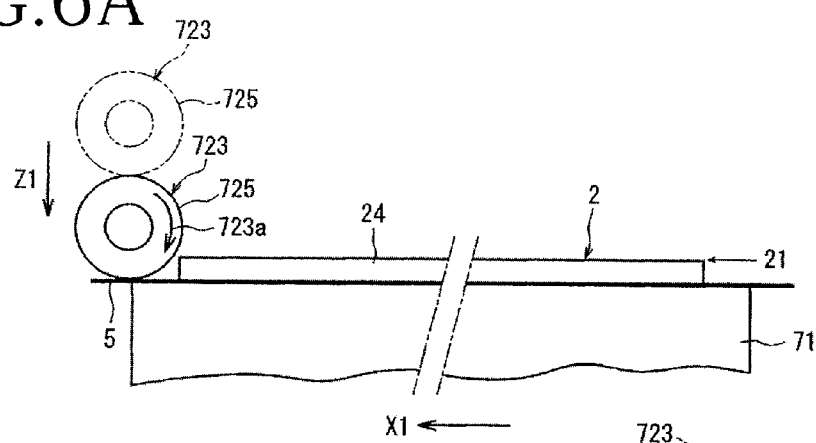
FIGS. 6A to 6D are views for illustrating the cutting step.
Figure 6B:
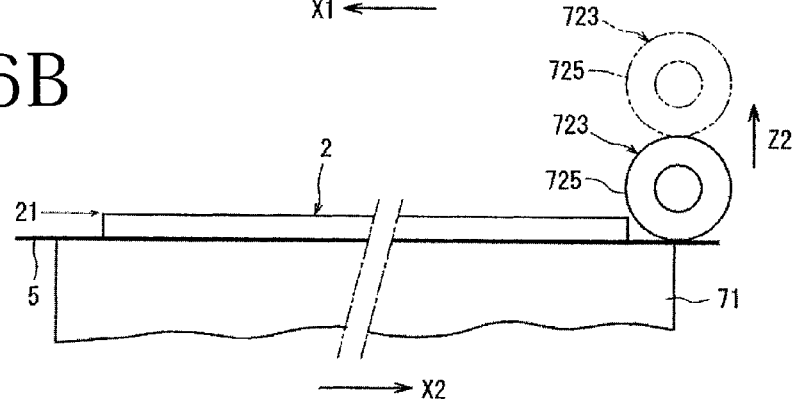
Figures 6C, 6D:
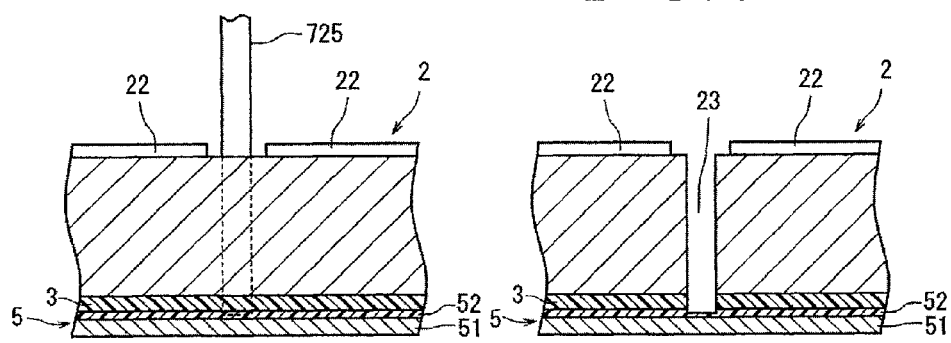

In the condition where the semiconductor wafer 2 held on the chuck table 71 is set at the cutting start position, the cutting blade 723 is lowered from a standby position shown by a phantom line in FIG. 6A to a working position shown by a solid line in FIG. 6A as shown by an arrow Z1. As shown in FIG. 6C, this working position is set so that the annular cutting edge 725 of the cutting blade 723 cuts into the cured adhesive layer 52 of the dicing tape 5 attached through the adhesive film 3 to the back side of the semiconductor wafer 2, but does not reach the base sheet 51 of the dicing tape 5.

Thereafter, the cutting blade 723 is rotated at a predetermined speed in the direction of the arrow 723a shown in FIG. 6A and the chuck table 71 is moved at a predetermined feed speed in the direction shown by an arrow X1 in FIG. 6A. When the other end (right end as viewed in FIG. 6B) of the predetermined division line 21 reaches the left side of the position directly below the cutting blade 723 by a predetermined amount as shown in FIG. 6B, the movement of the chuck table 71 is stopped. By feeding the chuck table 71 as rotating the cutting blade 723 in this manner, the semiconductor wafer 2 and the adhesive film 3 are cut along the predetermined division line 21 to form a cut groove 23 as shown in FIG. 6D (cutting step).

Thereafter, the cutting blade 723 is raised from the working position shown by a solid line in FIG. 6B to the standby position shown by a phantom line in FIG. 6B as shown by an arrow Z2, and the chuck table 71 is next moved in the direction shown by an arrow X2 in FIG. 6B to restore the position shown in FIG. 6A. Thereafter, the chuck table 71 is indexed in the direction (indexing direction) perpendicular to the sheet plane of FIG. 6A by an amount corresponding to the pitch of the division lines 21, thereby positioning the next division line 21 in alignment with the cutting blade 723. In the condition where the next division line 21 is aligned with the cutting blade 723, the cutting step mentioned above is performed along the next division line 21. Thereafter, the cutting step mentioned above is similarly performed along all of the other division lines 21 extending in the first direction on the semiconductor wafer 2.

For example, the cutting step mentioned above is performed under the following processing conditions.

Figure 7:
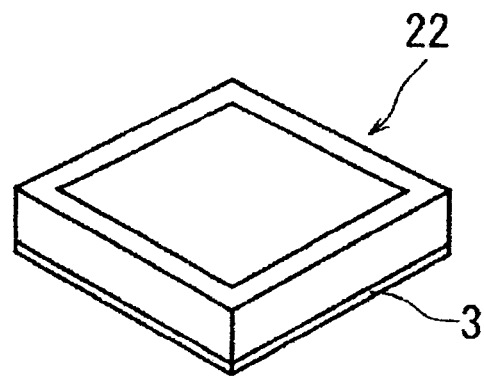
FIG. 7 is a perspective view of a device obtained by dividing the semiconductor wafer in the present invention.

Cutting blade: Outer diameter 50 mm, Thickness 30 µm
Rotational speed of cutting blade: 20000 rpm
Work feed speed: 50 mm/second After performing the cutting step along all of the division lines 21 extending in the first direction on the semiconductor wafer 2, the chuck table 71 is rotated 90 degrees to similarly perform the cutting step along all of the division lines 21 extending in the second direction perpendicular to the first direction on the semiconductor wafer 2. As a result, the semiconductor wafer 2 and the adhesive film 3 mounted on the back side of the semiconductor wafer 2 are cut along all of the division lines 21 extending in the first and second directions, thereby obtaining the individual devices 22 as chips, wherein the adhesive film 3 is mounted on the back side of each device 22 as shown in FIG. 7.

In the cutting step mentioned above, the annular cutting edge 725 of the cutting blade 723 is positioned so that the cutting edge 725 cuts into the cured adhesive layer 52 of the dicing tape 5 attached through the adhesive film 3 to the back side of the semiconductor wafer 2. Accordingly, the cutting edge 725 is supported by the cured adhesive layer 52, so that vibrations of the cutting edge 725 can be suppressed to thereby prevent chipping of each device.

Further, in the cutting step mentioned above, the annular cutting edge 725 of the cutting blade 723 is positioned so that the cutting edge 725 cuts into the cured adhesive layer 52, but does not reach the base sheet 51 of the dicing tape 5. That is, the base sheet 51 is not cut by the cutting edge 725, so that no burrs are generated to thereby prevent possible breaking of wire.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer along a plurality of crossing division lines to obtain a plurality of individual devices and mounting an adhesive film for die bonding on a back side of each device, said division lines being formed on a front side of said wafer to thereby define a plurality of separate regions where said respective devices are formed, said wafer processing method comprising:
- a wafer supporting step of mounting one side of said adhesive film on a back side of said wafer and attaching an other side of said adhesive film to a dicing tape composed of a base sheet and an ultraviolet curable adhesive layer formed on said base sheet, said adhesive film being attached to said ultraviolet curable adhesive layer of said dicing tape;
- an ultraviolet light applying step of applying ultraviolet light to said dicing tape to thereby cure said adhesive layer after performing said wafer supporting step; and
- a cutting step of rotating a cutting blade having a peripheral cutting edge to cut said wafer together with said adhesive film along said division lines after performing said ultraviolet light applying step, thereby dividing said wafer into said individual devices;
- said cutting edge of said cutting blade being positioned so that said cutting edge cuts partially into said cured adhesive layer in said cutting step.

* * * * *